(12) United States Patent
Boernert et al.

(10) Patent No.: US 8,890,524 B2
(45) Date of Patent: Nov. 18, 2014

(54) SAR REDUCTION IN PARALLEL TRANSMISSION BY K-SPACE DEPENDENT RF PULSE SELECTION

(75) Inventors: Peter Boernert, Hamburg (DE); Ingmar Graesslin, Boenningstedt (DE); Kay Nehrke, Ammersbek (DE)

(73) Assignee: Koninklijke Philips N.V., Eindhoven (NL)

( * ) Notice: Subject to any disclaimer, the term of this patent is extended or adjusted under 35 U.S.C. 154(b) by 385 days.

(21) Appl. No.: 13/260,580

(22) PCT Filed: Apr. 1, 2010

(86) PCT No.: PCT/IB2010/051423
§ 371 (c)(1),
(2), (4) Date: Sep. 27, 2011

(87) PCT Pub. No.: WO2010/113131
PCT Pub. Date: Oct. 7, 2010

(65) Prior Publication Data
US 2012/0019247 A1  Jan. 26, 2012

(30) Foreign Application Priority Data
Apr. 2, 2009  (EP) .................... 09157140

(51) Int. Cl.
| | | |
|---|---|---|
| G01R 33/48 | (2006.01) | |
| G01R 33/34 | (2006.01) | |
| G01R 33/565 | (2006.01) | |
| G01R 33/28 | (2006.01) | |
| G01R 33/3415 | (2006.01) | |
| G01R 33/561 | (2006.01) | |
| G01R 33/54 | (2006.01) | |

(52) U.S. Cl.
CPC .......... *G01R 33/3415* (2013.01); *G01R 33/543* (2013.01); *G01R 33/5659* (2013.01); *G01R 33/288* (2013.01); *G01R 33/5612* (2013.01)
USPC .......................................... 324/309; 324/307

(58) Field of Classification Search
USPC .................. 324/309, 307, 312, 314
See application file for complete search history.

(56) References Cited

U.S. PATENT DOCUMENTS

| 6,975,114 B1 | 12/2005 | Ledden |
| 7,336,145 B1 | 2/2008 | Zelinski et al. |

(Continued)

FOREIGN PATENT DOCUMENTS

| WO | 03093855 A1 | 11/2003 |
| WO | 2009034115 A1 | 3/2009 |

OTHER PUBLICATIONS

Brunner, D. O., et al.; A matrix approach for mapping array transmit fields in under a minute; 2008; Proc. Intl. Mag. Reson. Med.; 16:354.

(Continued)

*Primary Examiner* — Melissa Koval
*Assistant Examiner* — Rishi Patel

(57) ABSTRACT

When generating an MR image using a multi-channel transmit coil arrangement, SAR is reduced by employing a number of different RF pulses in a single scan. Each RF pulse exhibits a different performance and/or accuracy, resulting in different RF pulse-specific SAR values. As a result, the RF pulses differ slightly in actual excitation pattern, B1 waveform and/or k-space trajectory, etc. The average SAR over a single scan is thus reduced compared to a fixed RF pulse, without compromising image quality.

24 Claims, 6 Drawing Sheets

(56) References Cited

U.S. PATENT DOCUMENTS

| | | | |
|---|---|---|---|
| 2005/0110488 A1 | 5/2005 | Zhu | |
| 2007/0222445 A1* | 9/2007 | Hertz et al. | 324/307 |
| 2007/0247155 A1 | 10/2007 | Zhu | |
| 2008/0284439 A1 | 11/2008 | Xu et al. | |
| 2008/0303521 A1* | 12/2008 | Beatty et al. | 324/312 |
| 2010/0134105 A1* | 6/2010 | Zelinski et al. | 324/309 |

OTHER PUBLICATIONS

Fuderer, M.; The Information Content of MR Images; 1988; IEEE Trans. on Medical Imaging; 7(4)368-380.

Graesslin, I., et al.; A Minimum SAR RF Pulse Design Approach for Parallel Tx with Local Hot Spot Suppression and Exact Fidelity Constraint; 2008; Proc. Intl. Mag. Reson. Med.; 16:621.

Graesslin, I., et al.; SAR Reduction for Parallel Transmission using VERSE and k-space Filtering; 2007; Proc. Intl. Mag. Reson. Med.; 15:674.

Grissom, W., et al.; Spatial Domain Method for the Design of RF Pulses in Multicoil Parallel Excitation; 2006; MRM; 56:620-629.

Hugg, J. W., et al.; Routine Clinical Head MRI at 3.0 T with Optimized RF Power Management; 2001; Proc. Intl. Mag. Reson. Med.; 9:1349.

Kerr, A. B., et al.; Phase Constraint Relaxation in Parallel Excitation Pulse Design; 2007; Proc. Intl. Mag. Reson. Med.; 15:1694.

Lattanzi, R., et al.; Electrodynamic Constraints in Homogeneity and Radiofrequency Power Deposition in Multiple Coil Excitations; 2009; MRM; 61:315-334.

Liu, Y., et al.; Minimal-SAR RF Pulse Optimization for Parallel Transmission in MRI; 2008; IEEE EMBS Conf.; 5774-5777.

Nehrke, K., et al.; Eigenmode Analysis of Transmit Coil Array for SAR-reduced B1 Mapping and RF Shimming; 2009; Proc. Intl. Mag. Reson. Med.; 17:368.

Van Vaals, J. J., et al.; "Keyhole" method for accelerating imaging of contrast agent uptake; 1993; J. Magnetic Resonance Imaging; 3(4)abstract.

Weiger, M., et al.; Motion-Adapted Gating Based on k-Space Weighting for Reduction of Respiratory Motion Artifacts; 1997; MRM; 38:322-333.

Wu, X., et al.; SAR Reduction in Transmit SENSE Using Adapted Excitation k-Space Trajectories; 2007; Proc. Intl. Mag. Reson. Med.; 15:673.

Zelinski, A. C., et al.; Sparcity-Enforced Coil Array Mode Compression for Parallel Transmission; 2008; Proc. Intl. Mag. Reson. Med.; 16:1302.

Zelinski, A. C.; Chapter 9—Reduction of maximum local specific absorption rate via pulse multiplexing; in Zellinski AC: Improvements in magnetic resonance imaging excitation pulse design; 2008; MIT: pp. 217-253.

* cited by examiner

SAR REDUCTION IN PARALLEL TRANSMISSION BY K-SPACE DEPENDENT RF PULSE SELECTION

FIELD OF THE INVENTION

The present innovation finds particular application in magnetic resonance imaging (MRI) systems. However, it will be appreciated that the described techniques may also find application in other imaging systems, other magnetic resonance scenarios, other image data collection techniques, and the like.

BACKGROUND OF THE INVENTION

Parallel transmission in MRI systems has become a topic of considerable interest during the last few years. The use of multiple individual radio frequency (RF) transmit coils is used to overcome $B_1$ homogeneity limitations and to improve multi-dimensional RF pulses by shortening their duration. Of special concern in all these transmit applications is the specific absorption rate (SAR), which has to be kept below certain limits to avoid excessive patient heating. Different approaches have been discussed to reduce SAR in parallel transmission. The degree of freedom in RF pulse design allows selection of solutions with minimal SAR, e.g. via regularization techniques helping to enforce low SAR. Furthermore, the interplay between k-space trajectory and RF waveform can be used for SAR reduction (e.g., such as in a variable rate selective excitation, or VERSE, technique). The optimal RF pulse thus obtained is then used for the corresponding MR scan. In that respect, the parallel transmission RF pulse is optimized almost independently from the MR signal sampling process. The SAR limitation, particularly at high fields, is a serious problem in MR.

The present application provides new and improved systems and methods for reducing SAR in MR examinations, which overcome the above-referenced problems and others.

SUMMARY OF THE INVENTION

In accordance with one aspect, a method of acquiring MR data with reduced specific absorption rate (SAR) comprises applying a magnetic resonance sequence in which at least one RF pulse is repeatedly applied to generate MR scan data during an MR acquisition scan using two or more transmit coils, altering a composition of the repeatedly applied RF pulse such that the RF pulse causes lower SAR in some repetitions than in others, and acquiring the MR scan data in k-space.

In accordance with another aspect, a magnetic resonance system for reducing specific absorption rate (SAR) comprises two or more transmit RF coils, an RF pulse generator, and a processor that controls the RF pulse generator to apply an MR scan sequence with at least one repeatedly applied RF pulse. The processor additionally selects from among at least two pre-generated versions of the repeatedly applied RF pulses, each version exhibiting a different SAR, with different frequency components. Moreover, the processor supplies the RF pulse generator with higher frequency versions of the repeatedly applied RF pulse when acquiring MR data from a first region of k-space and lower frequency versions of the repeatedly applied RF pulse when acquiring MR data from a second region of k-space, and processes the MR data. The system further includes a display that displays the processed MR data.

One advantage is that the total SAR for the entire scan is reduced.

Another advantage is that image quality is improved or at least maintained.

Still further advantages of the subject innovation will be appreciated by those of ordinary skill in the art upon reading and understand the following detailed description.

BRIEF DESCRIPTION OF THE DRAWINGS

The drawings are only for purposes of illustrating various aspects and are not to be construed as limiting. Corresponding reference numerals when used in the various figures represent corresponding elements in the figures.

DETAILED DESCRIPTION OF EMBODIMENTS

Figure 1:
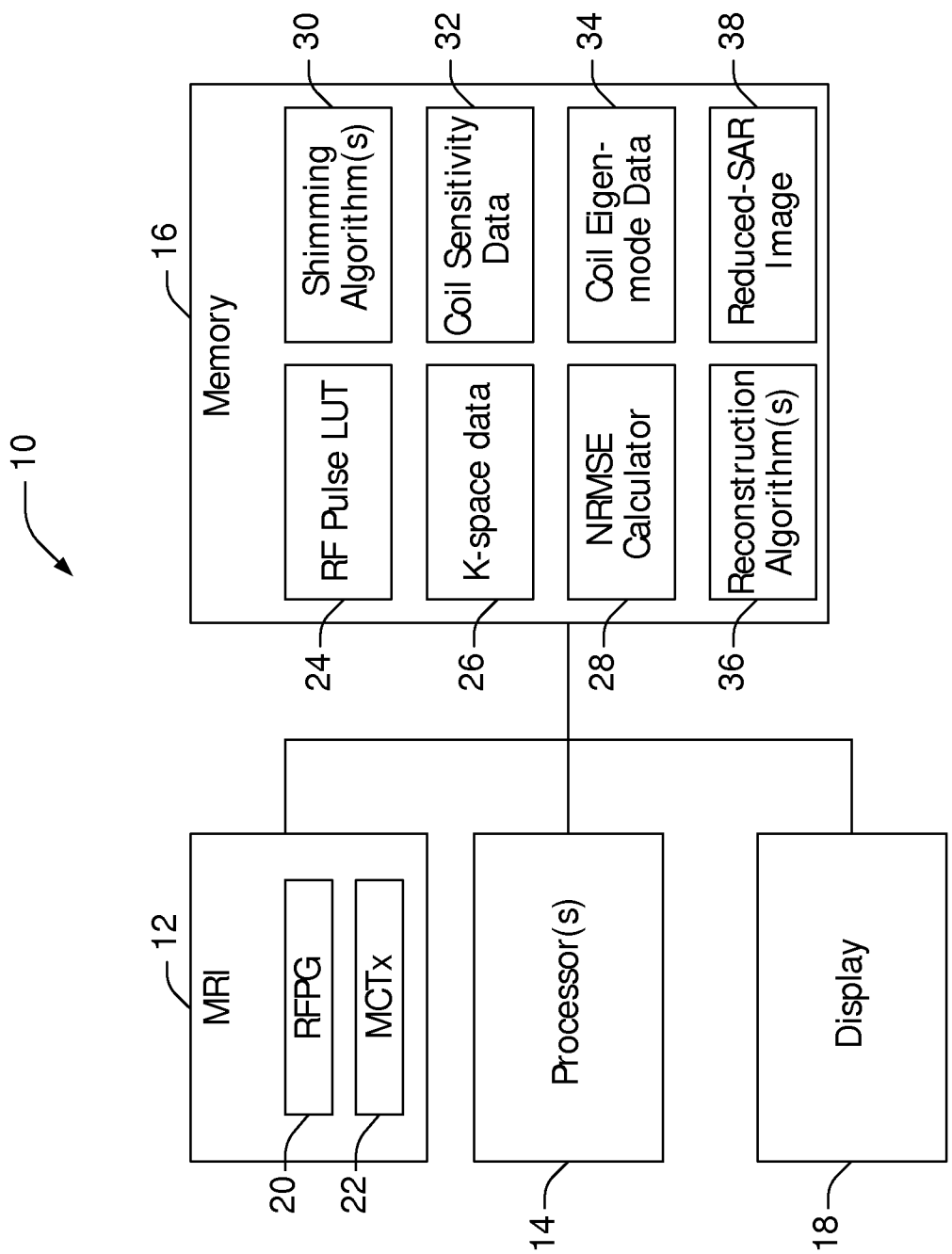
FIG. 1 illustrates a system that facilitates reducing SAR in multi-transmit MRI devices by varying RF pulses during an acquisition scan as a function of k-space location.

FIG. 1 illustrates a system 10 that facilitates reducing SAR in multi-transmit MRI devices by varying RF pulses during an acquisition scan as a function of k-space location. For example, RF pulses are designed with a preselected spatial definition. Pulses with higher spatial definition give more accurate images, but have a higher SAR. By using RF pulses with the standard spatial definition for the sequence in some regions of k-space and a reduced spatial definition in others, the overall SAR for the sequence is reduced. For instance, higher spatial definition pulses are used in the low frequency portions of k-space and lower spatial definition pulses are used in the high frequency regions of k-space, but also other assignments are possible. Particularly in MR scanners with multiple independently operated RF transmitters, there is more flexibility to design $B_1$ shimming pulses. This flexibility is employed by the described systems and methods to adjust also the $B_1$ shimming in accordance with the k-space region to reduce the overall SAR of a sequence.

The system 10 includes an MR device or scanner 12 that is coupled to a processor 14, a memory 16 (e.g., a computer-readable medium), and a display 18 on which information is displayed to a user. The memory stores, and the processor executes, one or more computer-executable instructions for performing the various functions described herein. It will be appreciated that the memory, processor, and/or the display may be separate from or integral to the MR device 12.

The MR device 12 includes an RF pulse generator 20 that generates radiofrequency (RF) $B_1$ pulses, each configured as instructed by the processor. The MR device also includes a multi-channel transmitter (MCTx) 22 that transmits the RF pulses over multiple channels. The memory 16 stores an RF pulse lookup table (LUT) 24, which includes a plurality of pre-generated RF pulse patterns cross-referenced to specific locations in k-space. The LUT 24 is accessed by the processor during an MR acquisition scan to identify specific RF pulses to be generated by the RFPG 20 and transmitted by the MCTx 22 in a specific sequence or pattern as respective regions of k-space are scanned. According to another aspect, the RF pulses are pre-calculated, stored to the LUT 24, and recalled as needed. K-space data 26 detected during the scan is stored to the memory 16. In a multi-channel MR system, there is usually a plurality of independent RF coils, each driven independently by a corresponding RF transmitter or a channel of the multi-channel transmitter 22.

The memory stores a normalized root mean square error (NRMSE) calculation algorithm 28, which is executed by the processor to estimate the performance of one or more variable RF pulse sequences or schemes, with respect to an acquisition scan using a fixed optimal RF pulse at infinite SNR. For a given NRMSE, the processor compares the average SAR for the Eigen-mode using different or variable RF pulses in a scan ($SAR_v$) versus a fixed RF pulse mode ($SAR_f$). Shimming algorithms 30 are also stored in the memory 16 and executed by the processor 14 to adjust $B_1$ shimming depending on the region of k-space. For instance, one or more Eigenmodes is used to shim the $B_1$ field when acquiring scan data for the high-frequency (peripheral) regions of k-space, while single central Eigenvalues are used to shim the $B_1$ field when acquiring data for low-frequency (central) regions of k-space. However, it will be appreciated that other schemes are conceivable as well.

The memory stores transmit coil sensitivity data 32 for a multi-element coil in the MR device 12, which information is analyzed by the processor 14. For instance, coil sensitivity information for each coil is decomposed into the respective Eigenmodes 34. Based on the desired accuracy level, different numbers of Eigen-modes are considered for RF shimming. In this manner, the processor selects an appropriate shimming algorithm 30 for achieving a desired SAR at a given region of k-space.

The memory additionally stores one or more reconstruction algorithms 36 (e.g., computer-executable instructions) that the processor executes to reconstruct the acquired k-space data 26 into an SAR-reduced MR image 38.

Parallel transmission, which is effected by the MCTx 22, is an efficient approach to improving $B_1$ transmit field homogeneity in high field MRI (e.g., greater than 3T) or to accelerate sophisticated multi-dimensional RF pulses. One problem associated with classical high field applications is the limiting specific absorption rate (SAR). The system 10 facilitates SAR reduction in the MR device 12, which employs parallel transmission techniques. Different areas in the sampled k-space of a magnetic resonance imaging scanner (MRI) or MR spectroscopy scanner (MRS) data acquisition exhibit different sensitivities to signal imperfections.

In multi-channel transmit scanners, each $B_1$ pulse is a concatenation of a $B_1$ component from each of the channels. By adjusting the relative configuration of each channel, differently-configured but "like" or similar RF pulses can be created. For example, in a spin-echo sequence, 180° inversion pulses are repeatedly applied. Instead of using a single type or fixed RF pulse for the entire image acquisition, the system 10 uses differently-configured RF pulses in a k-space-dependent manner, e.g. differently-configured 180° pulses. Each of these differently configured like RF pulses may exhibit a different performance (e.g., accuracy, k-space trajectory, channel amplitudes, phases, employed $B_1$-channels, etc.) resulting in a different SAR value. By using lower SAR RF pulses for some pulses of the scan, the average SAR over a single scan using differently-configured RF pulses can thus be reduced as compared to a scan that employs identically configured RF pulses, without sacrificing significant image quality. This concept may also be applicable to RF shimming, refocusing RF pulses, and to other magnetization preparation RF pulses used to tailor the longitudinal magnetization before signal sampling. The latter also includes RF pulses that are not spatially selective, but for instance, are chemical shift selective pulses. In this case the corresponding class of RF pulses to be used can differ in that respect.

Figure 2:
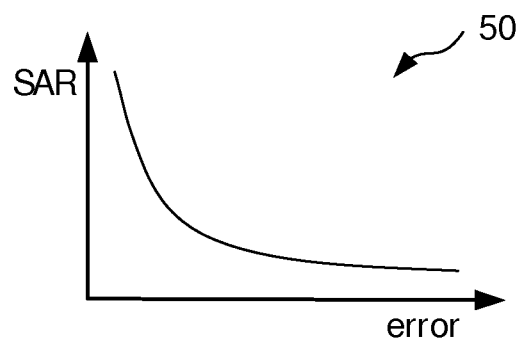
FIG. 2 illustrates a graph of a relationship between the SAR of an RF pulse and its overall accuracy and/or performance.

FIG. 2 illustrates a graph 50 of a relationship between the SAR of an RF pulse and its overall accuracy. High definition RF pulse performance corresponds to high SAR. In the described systems and methods, RF pulse design is considered in relation to the signal sampling process. One consideration of this approach is that different areas in k-space show different sensitivities to signal imperfections (see, e.g., Fuderer M. IEEE TMI 1988; 7:368-80; van Vaals J. et al. JMRI 1993; 3:671-75; Weiger M et al. MRM 1997; 38:322-33) which is known from key-hole imaging (see, e.g., van Vaals J. et al. JMRI 1993; 3:671-75) and motion adapted gating (see, e.g., Weiger M et al. MRM 1997; 38:322-33). Thus, instead of using a fixed RF pulse configuration for the entire MR scan, two or more different configurations of the repeated RF pulse are employed in a single scan. Each of these RF pulses may exhibit a different performance and/or accuracy, resulting in different RF pulse-specific SAR values. Thus, the RF pulses may differ slightly in actual excitation pattern, $B_1$ waveform, and/or k-space trajectory, etc. The average SAR over the scan thus can be reduced compared to a scan that uses fixed RF pulses, without sacrificing image quality.

Figure 3:
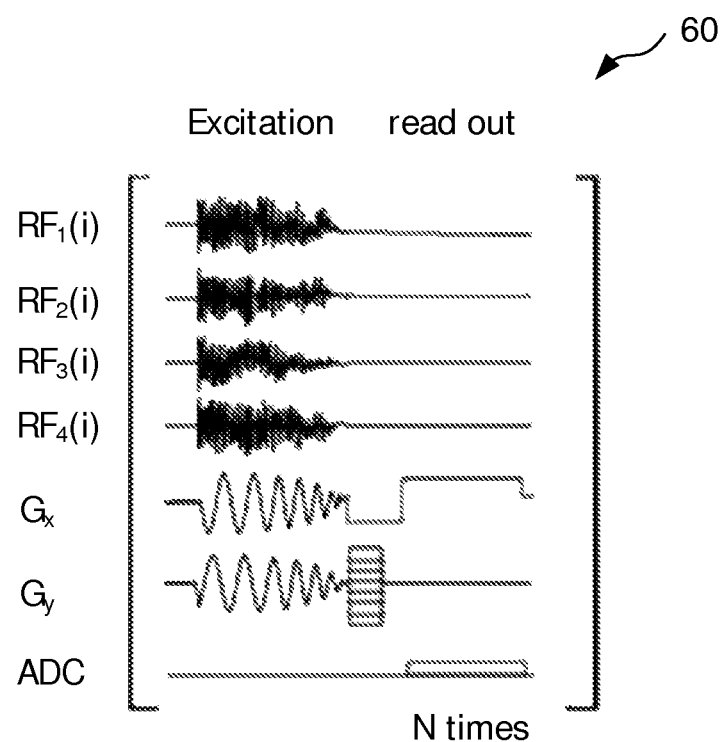
FIG. 3 illustrates an excitation readout for a local excitation using a 2D spatially selective RF pulse on a four channel parallel transmit system.

FIG. 3 illustrates excitation readout 60 for a local excitation using a 2D spatially selective RF pulse. The readout allows for 2D zoomed spin-warp imaging using four individual transmit RF channels, labeled $RF_1(i)$, $RF_2(i)$, $RF_3(i)$, and $RF_4(i)$, respectively. $G_x$ and $G_y$ represent waveforms for orthogonal magnetic gradients, and ADC is the analog-to-digital converter, showing when the device is active during the sequence. It will be noted that for each $k_y$, an individual RF pulse $RF(i)$ can be used to optimize the average SAR of the entire scan.

According to an example, a Cartesian spin-warp sampling scheme is considered. A 2D RF excitation pulse is used for localized MR, restricting the area from which the signal originates. Sampling is performed in a field of view (FOV) smaller than the field of excitation (FOX) of the employed RF pulse.

Figure 4:
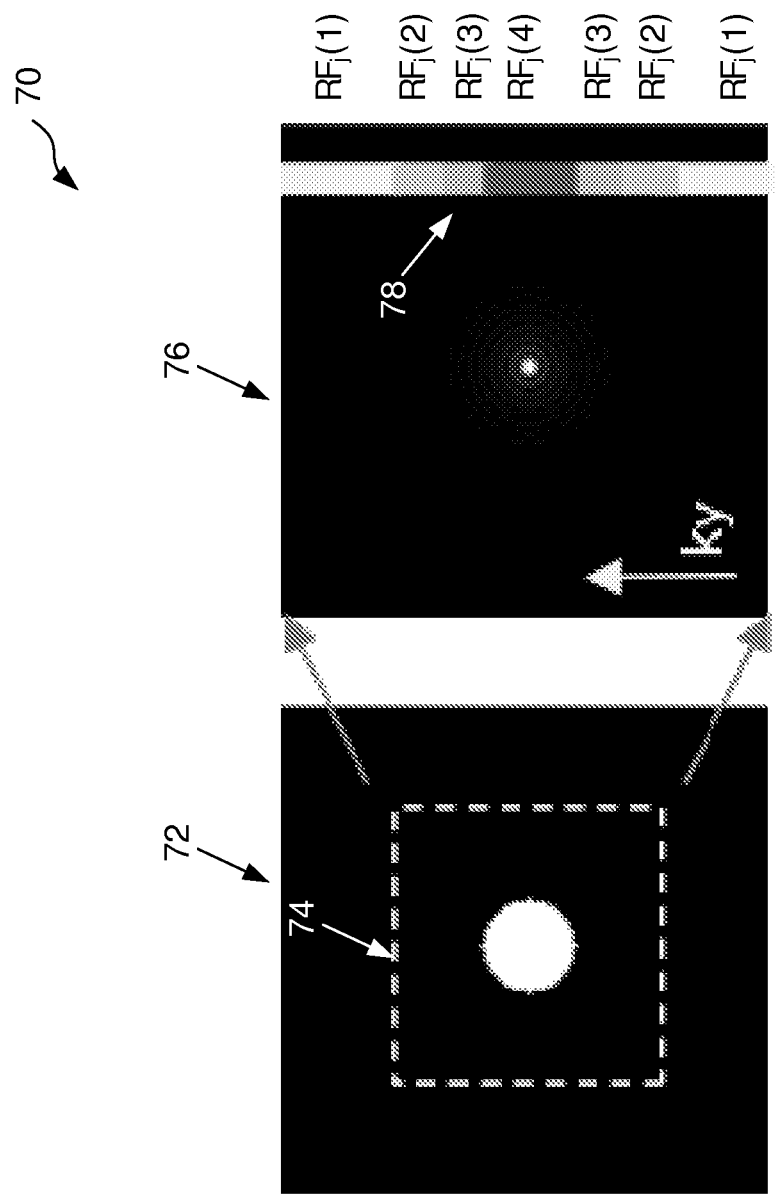
FIG. 4 illustrates a representation of signal excitation for individual lines in k-space performed using a class of RF pulses differing in their spatial definition.

FIG. 4 illustrates a representation 70 of signal excitation for individual lines in k-space performed using a class of RF pulses differing in their spatial definition. An RF pulse pattern given in the FOX 72 with sampling FOV 74 (dotted square) included (left) corresponds to an imaging k-space 76. The color bar 78 indicates that RF pulses with different spatial definitions are used for $k_y$ sampling. The spatial definitions $RF_j(1)$, $RF_j(2)$, $RF_j(3)$, $RF_j(4)$, are realized by filtering the RF pulse target magnetization by a Gaussian kernel (0.1-4.0 pixel FWHM with respect to the sampling FOV) and calculating the parallel transmit RF pulses according to Grissom et al. (MRM 2006; 56:620-29), while estimating their corresponding SAR (see, e.g., Graesslin I, et al. 2008; ISMRM 621). The repeatedly applied RF pulse is created with different degrees of spatial definition, hence different levels of SAR, from a low definition $RF_j(4)$ near the center of k-space to progressively higher levels of spatial definition adjacent the edges of k-space. The mapping of the individual RF pulses to the corresponding k-space location can be done empirically or one can use the previously mentioned NRMSE calculation algorithm. MR signal sampling may be performed assuming a 128×128 matrix. To determine which RF pulse is used to generate the signal for a given phase encoding step $k_y$, a trial and error search may be made (e.g., by the processor 14 of FIG. 1), taking into account the energy of the k-space representation of the excitation pattern.

The use of differently-configured like RF pulses in a single acquisition scan may result in data inconsistencies. Therefore, a determination is made regarding whether a resulting error is dominated by normal image noise or by artifacts peaking out (i.e., exceeding values) of the noise floor. In one example, a predetermined SNR (e.g., 15) may be assumed. To judge the performance of the different RF pulse configurations, a normalized root mean square error (NRMSE) is calculated with respect to an acquisition scan using a fixed and optimal RF pulse configuration at infinite SNR.

Table 1 provides exemplary data that illustrates the compromise between potential SAR reductions at the cost of a slightly increased excitation error (NRMSE).

TABLE 1

| Set | NRMSE | $SAR_v$ (%) | $SAR_f$ (%) |
|---|---|---|---|
| #0 | 0.18 | / | 100 |
| #1 | 0.20 | 84 | 91 |
| #2 | 0.23 | 79 | 82 |
| #3 | 0.24 | 61 | 76 |
| #4 | 0.25 | 52 | 69 |

For a given error (NRMSE), the average SAR values are compared for the mode using different or variable RF pulse configurations in a scan ($SAR_v$) versus a fixed configuration RF pulse mode ($SAR_f$), employing the best RF pulse for the entire scan. Greater SAR reduction is achieved when higher errors are tolerated, which is dependent on the given and/or expected signal-to-noise ratio (SNR). In case of a low SNR, which corresponds to a larger NRMSE (see the 0.25 case in Table 1, above), SAR is reduced by 33%. However, the exemplary scenario described above may not be optimal because frequency encoding is involved, which can obscure the results. Pure 2D phase encoding can thus be employed to improve the efficacy of the described techniques. For instance, this concept can be applied to refocusing RF pulses and to magnetization preparation RF pulses of all types.

Figure 5:
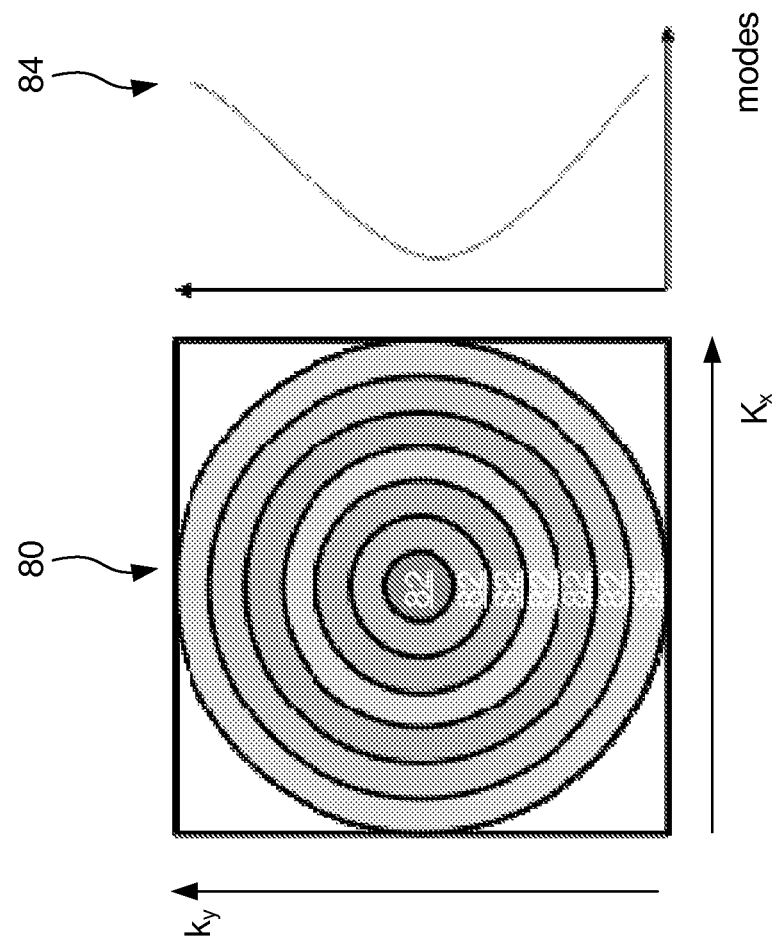
FIG. 5 illustrates a circular segment shaped arrangement of different areas in a 2D sampling k-space. Eight different parallel-transmit RF pulses are pre-calculated and applied, if the corresponding phase encoding step $k_x$, $k_y$, is measured.

FIG. 5 illustrates a circular ring arrangement in a 2D sampling of k-space 80. In each ring 82, the RF pulse is configured from different components (i.e., differently configured) to cause different amounts of SAR. In case of RF shimming, the same basic RF wave form and k-space trajectory can be used for each RF pulse, but a set of different transmit amplitudes and phases may be used for the individual channels in the different k-space locations. The curve 84 schematically indicates in a one-dimensional (radial) manner the number of Eigen-modes used for shimming, i.e. greatest shimming at the center of k-space with lesser shimming toward the periphery.

In one embodiment, two or more pulse configurations are pre-computed for each type of pulse (e.g., by the processor 14 of FIG. 1) and stored (e.g., in the memory 16 of FIG. 1). For instance, a computer program (e.g., stored in the memory 16 and executed by the processor 14) is provided, which selects the corresponding RF pulse configurations or RF pulses according to the k-space sampling step to be performed. In addition to the different $B_1$-waveforms for the different RF channels, if the k-space trajectory is also to be changed during scanning, it would be possible to have the corresponding gradient waveforms pre-stored and activated during the scan as well.

To further facilitate understanding of the described systems and methods, the following example is provided, which may be executed by the system 10 of FIG. 1. A 3D MRI scan is performed in a high field system. $B_1$ shimming is employed to reduce the $B_1$ variation caused by wave-propagation effects. On each RF channel, the same basic RF pulse waveform (e.g., a Sinc waveform for slice selection in the presence of a selection gradient, or the like) is propagated, but the amplitudes and phases ($a_i$, $\phi_i$) are different for the i different channels to facilitate RF shimming. A number of different RF shim sets ($a_i$, $\phi_i$) are calculated before the scan, all differing in the corresponding SAR and thus differing slightly in their $B_1$ shimming performance.

In the corresponding 2D phase encoding space of the sampling scheme, different regions are defined for which the different RF shim settings are applied. In this particular example, in the central part of k-space, low SAR settings are employed, because here the low spatial frequencies are to be acquired, justifying the use of RF shim settings neglecting high spatial frequencies. For the higher phase encoding steps in the k-space, RF shim settings with better spatial definition but higher SAR are used. Without any knowledge about the object to be scanned, a simple RF pulse application pattern is used as given in FIG. 5. The curve 84 indicates the desired number of coil specific modes, which are related to the spatial accuracy and SAR of the RF pulse. It will be appreciated that the described distribution is provided for illustrative purposes, and is not to be construed in a limiting sense, and that other distributions are conceivable in accordance with the herein-described features and aspects.

Figure 6:
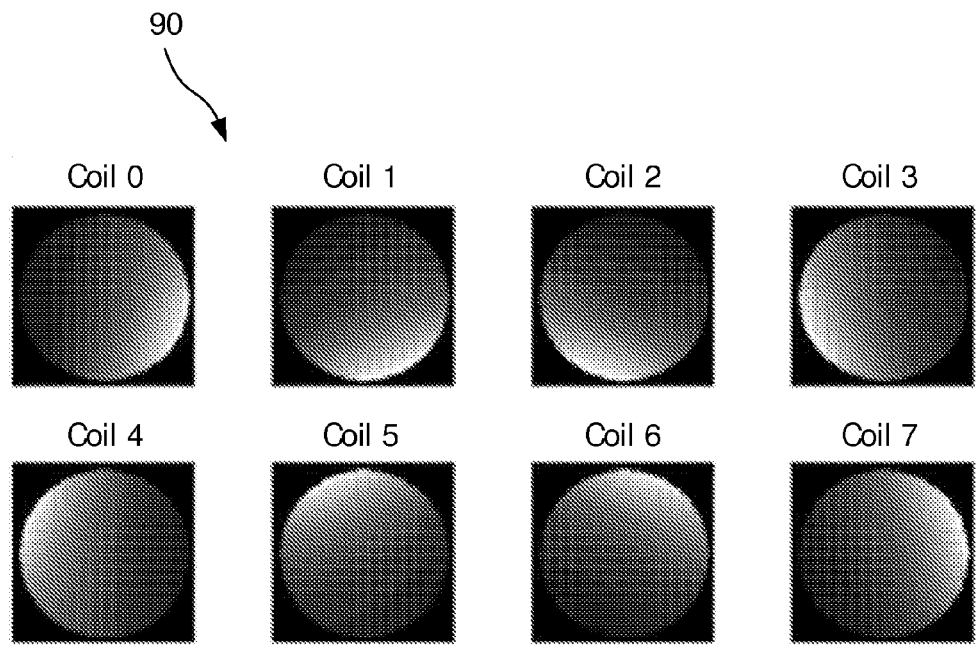
FIG. 6 shows coil sensitivities for eight transverse $B_1$ coils in an eight-channel transmit coil.
Figure 7:
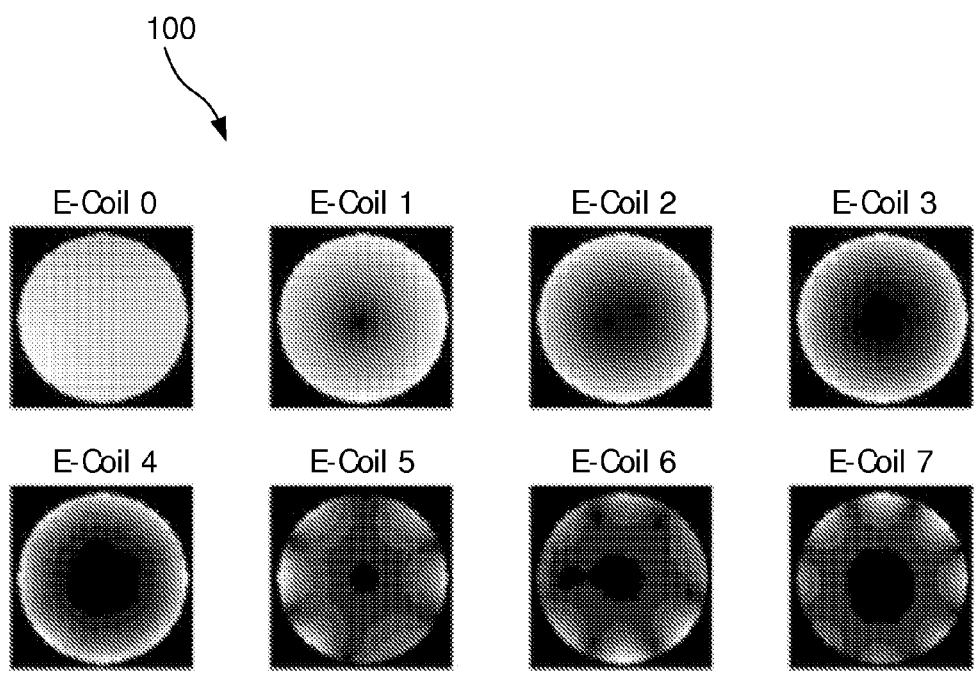
FIG. 7 shows the corresponding Eigen-modes of the eight-channel coil arrangement.

To further this example, FIGS. 6 and 7 illustrate an Eigenmodes approach to manipulating the RF pulse performance and correspondingly the SAR. FIG. 6 shows coil sensitivities 90 for eight transverse $B_1$ coils in an eight-channel transmit coil, wherein the coils are respectively labeled coil 0-coil 7. FIG. 7 shows the Eigen-modes 100 for the eight-channel transmit coil configuration, again respectively labeled as E-Coil 0-E-Coil 7. It will be understood that that these Eigenmodes can also be considered as virtual coils; accordingly, the term "coil" is used in the description thereof with regard to FIG. 7.

The transmit sensitivities of the multi-element coil can be decomposed into their Eigen-modes. Based on the desired accuracy level, different numbers of Eigen-modes are considered for RF shimming. The realization of each Eigenmode is related to a specific RF power that corresponds to a given SAR. However, other virtual coil decompositions may be considered, which capture spatial transmit properties of the array and which are related to SAR. Such decompositions are also called "modes." As the method is iteratively performed, the currently highest Eigen-mode can be omitted and a $B_1$ shimming problem solved using the remaining Eigen modes to determine shimming coefficients ($a_i$, $\phi_i$) that exhibit reduced SAR.

According to another example, a 2D RF pulse is used for selective local excitation as described with regard to FIG. 3. Additionally or alternatively, different ranges of pulse frequency components are used to generate magnetization preparation RF pulses in multiple-channel transmit systems.

Figure 8:
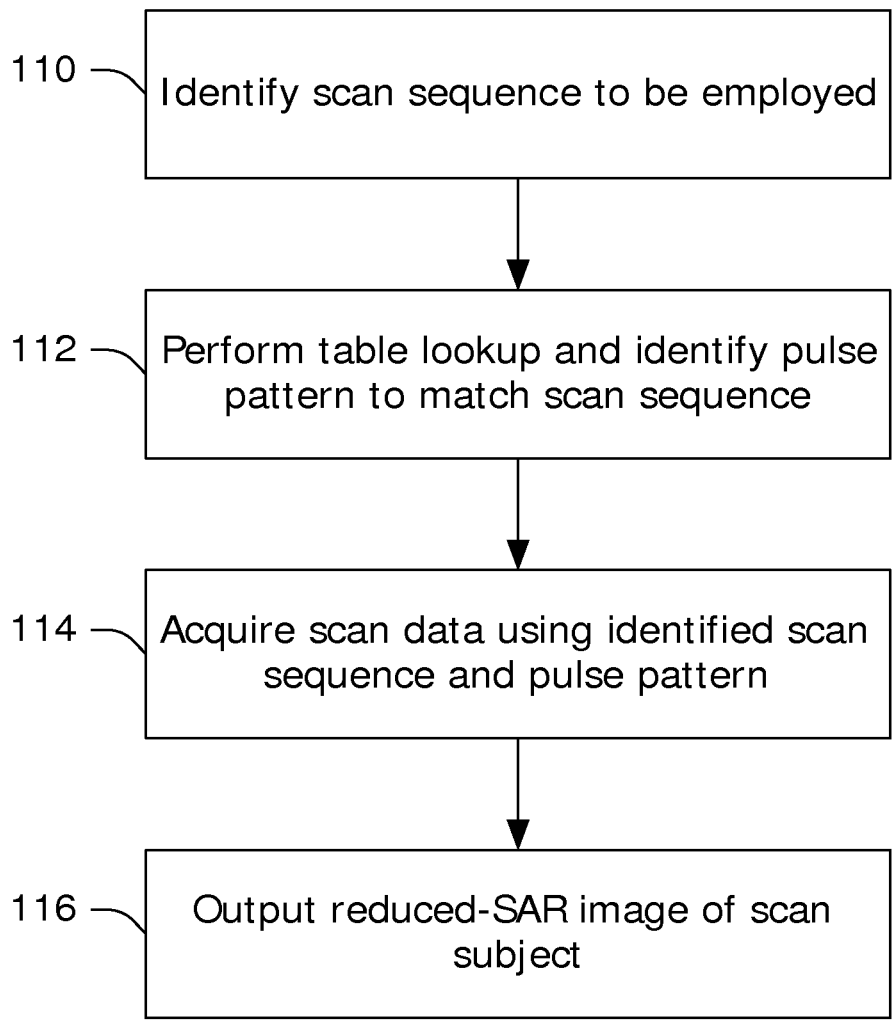
FIG. 8 illustrates a method for reducing SAR in a multi-channel transmit coil MRI device, in accordance with one or more aspects described herein.

FIG. 8 illustrates a method for reducing SAR in a multi-channel transmit coil MRI device 12 (FIG. 1), in accordance with one or more aspects described herein. At an identification step 110, a scan sequence to be employed by the MRI device (12) is identified. The scan sequence includes information describing an order of k-space data acquisition, such as scanning peripheral (high-resolution) k-space and then central (low-resolution) k-space, or vice-versa. At a lookup table step 112, a table lookup is performed to identify a pre-generated pulse pattern that matches the identified scan sequence. The pulse pattern typically includes RF preparation pulses, excitation pulses, and other magnetization manipulation pulses. For each RF pulse, at least two different pulse configurations are stored, e.g., a spatially accurate pulse configuration with low and high frequency components, and a spatially less-accurate pulse configuration with or without reduced high frequency components. The higher-frequency pulses are employed during acquisition of periphery k-space data, and lower-frequency pulses are employed during acquisition of central k-space data, although it will be appreciated that other orders are contemplated and intended to be considered within the scope and breadth of the innovation as described herein. For instance, if the identified scan sequence acquires periphery k-space data followed by central k-space data, then a pulse pattern that includes high frequency RF pulses followed by low frequency RF pulses is identified.

At a data acquisition step 114, the identified scan sequence is executed using the identified pulse pattern to acquire MR scan data. At an image output step 116, an SAR-reduced MR image is output on a display (e.g., after reconstruction of the acquired scan data, etc.). In this manner, variable RF pulses are employed to reduce SAR in an MR image.

According to another embodiment, $B_1$ field shimming is performed to reduce SAR. For instance, one or more Eigenmodes can be employed in a shimming algorithm when acquiring periphery k-space data, while a single central Eigenmode can be employed in the shimming algorithm when acquiring central k-space data.

The components of a given RF pulse can be varied by varying the relative contribution of the transmit elements of a multi-transmit system, varying the frequency components, or the like.

The invention has been described with reference to exemplary embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A method of acquiring MR data with reduced specific absorption rate (SAR), comprising act of:
   applying a magnetic resonance sequence in which at least one RF pulse is repeatedly applied to generate MR scan data during an MR acquisition scan using two or more transmit coils;
   altering frequency components of the repeatedly applied RF pulse such that the RF pulse causes lower SAR in some repetitions than in others;
   acquiring the MR scan data in k-space; and
   shimming a B1 field using one or more Eigenmodes when acquiring periphery k-space data, wherein based on a desired accuracy level, different numbers of Eigenmodes are used for the shimming act; and
   shimming the B1 field using a single central Eigenmode when acquiring central k-space data.

2. The method according to claim 1, further including acts of:
   reconstructing the scan data into an image; and
   at least one of displaying and storing the image.

3. The method according to claim 1, wherein the lower SAR RF pulses have lower frequency components and the other RF pulses further include higher frequency components.

4. The method according to claim 1, wherein the components of the repeatedly applied RF pulses include contributions from each of a plurality of transmit channels and wherein the act of altering the frequency components of the repeatedly applied RF pulse includes altering a weighting among the contributions and the RF pulse k-space trajectory.

5. The method according to claim 3, wherein the high frequency RF pulses are at least two-dimensional RF pulses.

6. The method according to claim 1, wherein the RF pulses are magnetization preparation RF pulses employed in a multiple-channel transmit system.

7. The method according to claim 1, wherein the repeatedly applied RF pulses with lower SAR have a lower spatial resolution, and repeatedly applied pulses with higher SAR have a higher spatial resolution.

8. A multi-transmit channel MRI device including:
   an RF pulse generator that generates different versions of repeatedly applied RF pulses; and
   a processor configured to:
     apply a magnetic resonance sequence in which at least one RF pulse is repeatedly applied to generate MR scan data during an MR acquisition scan using two or more transmit coils;
     alter frequency components of the repeatedly applied RF pulse such that the RF pulse causes lower SAR in some repetitions than in others; and
     acquire the MR scan data in k-space; and
   shimming a B1 field using one or more Eigenmodes when acquiring periphery k-space data, wherein based on a desired accuracy level, different numbers of Eigenmodes are used for the shimming act; and
   shimming the B1 field using a single central Eigenmode when acquiring central k-space data.

9. A non-transitory computer readable medium comprising computer instructions which, when executed by a processor, configure the processor to perform a method of acquiring MR data with reduced specific absorption rate (SAR), comprising act of:
   apply a magnetic resonance sequence in which at least one RF pulse is repeatedly applied to generate MR scan data during an MR acquisition scan using two or more transmit coils;
   alter frequency components of the repeatedly applied RF pulse such that the RF pulse causes lower SAR in some repetitions than in others; and
   acquire the MR scan data in k-space; and
   shimming a B1 field using one or more Eigenmodes when acquiring periphery k-space data, wherein based on a desired accuracy level, different numbers of Eigenmodes are used for the shimming act; and
   shimming the B1 field using a single central Eigenmode when acquiring central k-space data.

10. A magnetic resonance system for reducing specific absorption rate (SAR), the system including:
   two or more transmit RF coils;
   an RF pulse generator;
   a processor configured to:
      control the RF pulse generator to apply an MR scan sequence with at least one repeatedly applied RF pulse;
      select from among at least two pre-generated versions of the repeatedly applied RF pulses, each version exhibiting a different SAR, with different frequency components;
      supply the RF pulse generator with higher frequency versions of the repeatedly applied RF pulse when acquiring MR data from a first region of k-space and lower frequency versions of the repeatedly applied RF pulse when acquiring MR data from a second region of k-space;
      shim a B1 field using one or more Eigenmodes when acquiring periphery k-space data, wherein based on a desired accuracy level, different numbers of Eigenmodes are used for the shimming act; and
      shim the B1 field using a single central Eigenmode when acquiring central k-space data;
      process the MR data; and
   a display configured to display the processed MR data.

11. The system according to claim 10, wherein the RF coil includes a plurality of RF transmit coils, each RF coil being connected with a corresponding RF pulse generator, and wherein the high frequency RF pulses are at least two-dimensional RF pulses.

12. The system according to claim 10, wherein the first region of k-space is one of a central region of k-space and a peripheral region of k-space, and wherein the second region of k-space is the other of the central region of k-space and the peripheral region of k-space.

13. The method of claim 1, wherein the frequency components determine spatial definition of the RF pulses, wherein the frequency components of the repeatedly applied RF pulses include contributions from each of a plurality of transmit channels, wherein the act of altering the frequency components of the repeatedly applied RF pulse includes altering a weighting among the contributions and the RF pulse k-space trajectory, and wherein the weighting comprises different amplitudes and phases for each of the plurality of transmit channels.

14. The multi-transmit channel MRI device of claim 8, wherein the frequency components determine spatial definition of the RF pulses, wherein the frequency components of the repeatedly applied RF pulses include contributions from each of a plurality of transmit channels, wherein the processor alters the frequency components of the repeatedly applied RF pulse by altering a weighting among the contributions and the RF pulse k-space trajectory, and wherein the weighting comprises different amplitudes and phases for each of the plurality of transmit channels.

15. The non-transitory computer readable medium device of claim 9, wherein the frequency components determine spatial definition of the RF pulses, wherein the frequency components of the repeatedly applied RF pulses include contributions from each of a plurality of transmit channels, wherein the act of altering the frequency components of the repeatedly applied RF pulse includes altering a weighting among the contributions and the RF pulse k-space trajectory, and wherein the weighting comprises different amplitudes and phases for each of the plurality of transmit channels.

16. The magnetic resonance system of claim 10, wherein the frequency components determine spatial definition of the RF pulses, wherein the frequency components of the repeatedly applied RF pulses include contributions from each of a plurality of transmit channels, wherein the processor alters the frequency components of the repeatedly applied RF pulse by altering a weighting among the contributions and the RF pulse k-space trajectory, and wherein the weighting comprises different amplitudes and phases for each of the plurality of transmit channels.

17. The method according to claim 1, wherein the repeatedly applied RF pulses with higher frequency components are used to acquire the MR scan data in a periphery region of k-space, and the RF pulses with lower frequency components are used to acquire the MR scan data in a central region of k-space.

18. The method according to claim 1, wherein the repeatedly applied RF pulses with higher frequency components are used to acquire the MR scan data in a central region of k-space, and the RF pulses with lower frequency components are used to acquire the MR scan data in a periphery region of k-space.

19. The multi-transmit channel MRI device according to claim 8, wherein the repeatedly applied RF pulses with higher frequency components are used to acquire the MR scan data in a periphery region of k-space, and the RF pulses with lower frequency components are used to acquire the MR scan data in a central region of k-space.

20. The multi-transmit channel MRI device according to claim 8, wherein the repeatedly applied RF pulses with higher frequency components are used to acquire the MR scan data in a central region of k-space, and the RF pulses with lower frequency components are used to acquire the MR scan data in a periphery region of k-space.

21. The non-transitory computer readable medium according to claim 9, wherein the repeatedly applied RF pulses with higher frequency components are used to acquire the MR scan data in a periphery region of k-space, and the RF pulses with lower frequency components are used to acquire the MR scan data in a central region of k-space.

22. The non-transitory computer readable medium according to claim 9, wherein the repeatedly applied RF pulses with higher frequency components are used to acquire the MR scan data in a central region of k-space, and the RF pulses with lower frequency components are used to acquire the MR scan data in a periphery region of k-space.

23. The magnetic resonance system according to claim 10, wherein the repeatedly applied RF pulses with higher frequency components are used to acquire the MR scan data in a periphery region of k-space, and the RF pulses with lower frequency components are used to acquire the MR scan data in a central region of k-space.

24. The magnetic resonance system according to claim 10, wherein the repeatedly applied RF pulses with higher frequency components are used to acquire the MR scan data in a central region of k-space, and the RF pulses with lower frequency components are used to acquire the MR scan data in a periphery region of k-space.

* * * * *